OR 4,013,342

United States Patent
Narodny

[11] 4,013,342
[45] Mar. 22, 1977

[54] KEYBOARD USING OPTICAL SWITCHING

[76] Inventor: Leo H. Narodny, Martin's Bay, St. John, Barbados

[22] Filed: Dec. 19, 1975

[21] Appl. No.: 642,305

[52] U.S. Cl. .......................... 350/96 C; 350/96 R
[51] Int. Cl.² ........................................ G02B 5/14
[58] Field of Search .................... 350/96 C, 96 R

[56] References Cited
OTHER PUBLICATIONS

Ludeman "Miniature Optical Keyboard" IBM Technical Disc. Bulletin vol. 15 No. 11 Apr. 1973 pp. 3348–3349.

Sharp et al. "Optical Keyboard" IBM Tech. Disc. Bulletin vol. 5, No. 10, Mar. 1963 p. 127.

Primary Examiner—John K. Corbin
Assistant Examiner—Stewart Levy
Attorney, Agent, or Firm—Morton, Bernard, Brown, Roberts & Sutherland

[57] ABSTRACT

The invention relates to keyboard devices using optical switching and includes novel light distribution means to multiple fiber optics, switching means between fiber optics, and collection means from multiple fiber optics to a single point.

7 Claims, 32 Drawing Figures

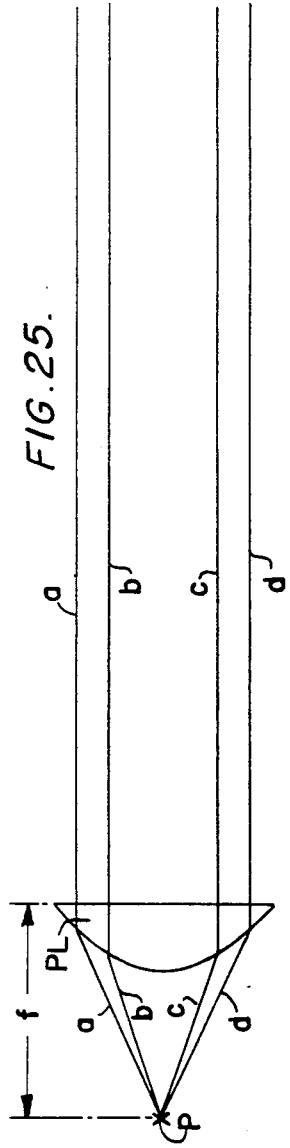
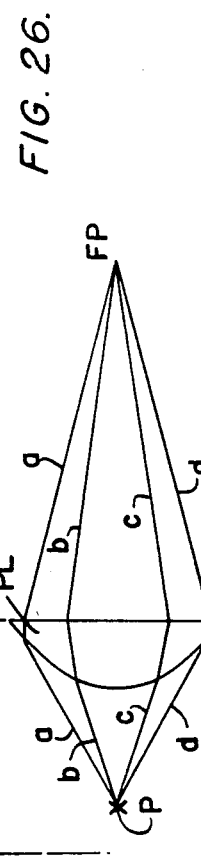
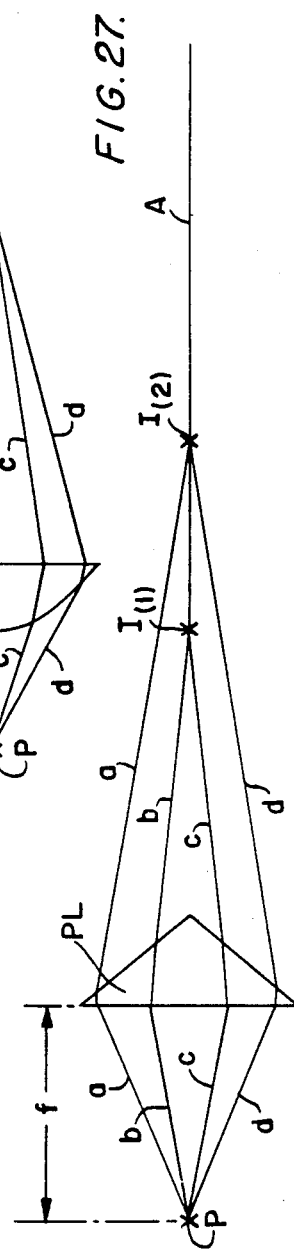
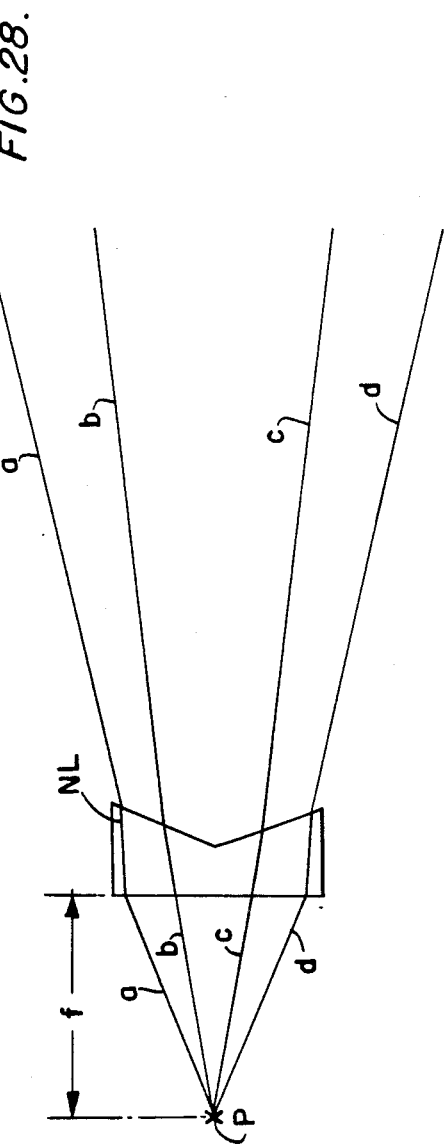

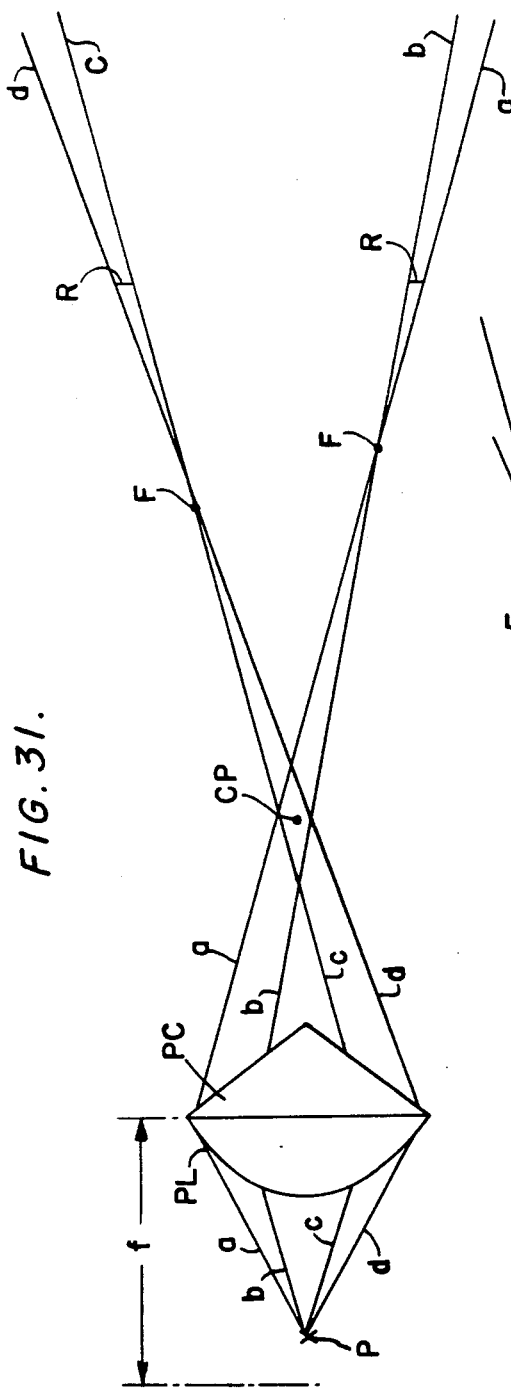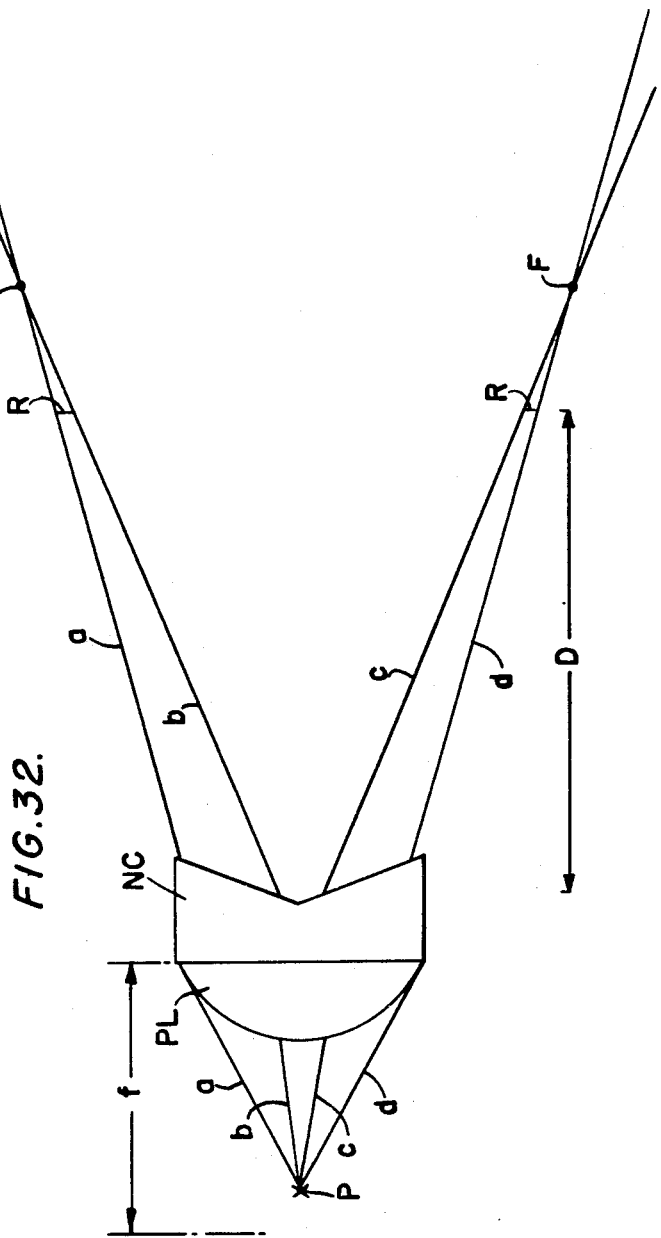

KEYBOARD USING OPTICAL SWITCHING

CROSS-REFERENCE TO RELATED APPLICATION

The present invention is disclosed in my prior patent application entitled Keyboard Using Optical Switching, filed June 13, 1973, Ser. No. 370,450, and in my prior application Ser. No. 478,509 filed June 12, 1974, entitled Keyboard Using Optical Switching, now U.S. Pat. No. 3,886,544. granted May 27, 1975.

FIELD OF INVENTION

This invention relates to light transmission and more particularly, multiple light transmission from a single source and collection from multiple sources to a single point. Specific applications include keyboard for a computer or a telecommunication, particularly remote keyboard devices, multiple illumination for instrumentation and sensing, and signalling and monitoring.

DESCRIPTION OF PRIOR ART

A conventional means of actuating keyboards, whether an electric typewriter or a computer terminal, is today a make-and-break electrical circuit. This circuit, in the electric typewriter, had the advantage of simplicity but the disadvantage of non-reliability. A typical modern keyboard for a computer insulates the make-and-break circuit for each character key within a vacuum thus greatly increasing reliability, but likewise substantially increasing the cost.

An early disclosure of optical circuits is the 1939 patent, of D. A. Roberts U.S. Pat. No. 2,168,886, showing rotatable prisms attached to keys which keys deflect light in air down a tube to a photocell.

The 1970 patent of R. A. Shurtliff U.S. Pat. No. 3,516,529, discloses multiple channels of light in air shining on associated photo tubes. Each key selectively blocks one or more channels of light when depressed, thus creating the desired coded signal.

The 1971 patent of W. C. Leone et al. U.S. Pat. No. 3,581,003, discloses a keyboard with coded output using fiber optics. In the first variation, a code for all characters in sequences is continuously generated and selectively released by depressing the key. In the second variation, the key depression activates its channel and the light is directed onto a coded screen and read by an extended photo electric sensor.

The optical switch for this keyboard also has two variations. The simpler one is an interrupted fiber optic with a mask blocking the light channel when the key is in a normal position and removed from the channel when the key is depressed. The second variation is also an interrupted fiber optic in which the ends are parallel and a semi-circular fiber optic portion caps the two ends when the key is depressed, thus transmitting the light.

The conventional means of directing a light source to a bundle of fiber optics is disclosed in 1971 patent of W. Pabst U.S. Pat. No. 3,565,524. This means is simply a focusing lens directed on the bunched optical fibers.

Another system for distributing light to fiber optics is shown in the 1972 patent of J. R. Keller et al. U.S. Pat. No. 3,638,008. A conventional light bulb is mounted at one focal point of an elliptical reflector. A harness holds the bundle of fiber optics directed towards the other focal point on which the rays converge and then diverge. This system collects a substantial portion of the light in the fiber optics and insures fairly uniform illumination but a very large portion of the light is lost.

A conical lens is described in the 1956 patent of J. J. McLeod U.S. Pat. No. 2,759,393, and in the Journal of Optical Society of America, Vol. 44, pp. 592–597 (1954). The lens is termed an axicon and it differs from a conventional lens in that one surface, while inclined to the axis is not curved, and therefore the axicon forms an image of a point source at a range of points along its axis.

SUMMARY OF INVENTION

This invention of improved light distribution switching and collection means makes practical the use of an optical keyboard.

The present invention, by way of example, allows the distribution of light from an extremely small point source to each of the character and special purpose keys of a keyboard and the collection of that light and selective illumination of photoelectric transducers, creating the required signal for input to the computer.

The elimination of the complex optical systems referenced in the prior art section results in both lower cost and higher reliability, making the optical keyboards using the invention herein disclosed competitive with the conventional keyboards using wired electronics and circuits.

In an optically actuated keyboard, a single source of light is used to activate, for instance, from one to six photoelectric transducers, creating a signal indicative of up to 64 characters. In this instance the light source must be of sufficient power to be divided into 64 components, each component of which has sufficient power to operate any one or all of the photoelectric transducers.

Additional power is required for the loss in (a) distributing the light to fiber optics for each of the characters, (b) transmitting the light to the character key, (c) coupling the light with a switch, (d) transmitting the light to the photoelectric transducers, and (e) directing it onto the photoelectric transducers.

The minimum power of the light is thus 384 times the power required to operate the photoelectric transducer and high losses for the reasons (a–e) outlined above, can force the light to be several thousand times that required to operate a photoelectric transducer. It is apparent, therefore, that extremely high efficiency in distribution, transmission, switching and coupling is of prime importance in an optical keyboard.

This application discloses an optical keyboard utilizing fiber optic systems which possess extremely high conductivity with low losses, and further discloses a light distributor using an axicon lens and a light switch using an ellipsoidal reflector.

DESCRIPTION OF DRAWINGS

FIGS. 25–32 are ray tracings of various lens systems.

DESCRIPTION OF ELEMENTS

Figure 1:
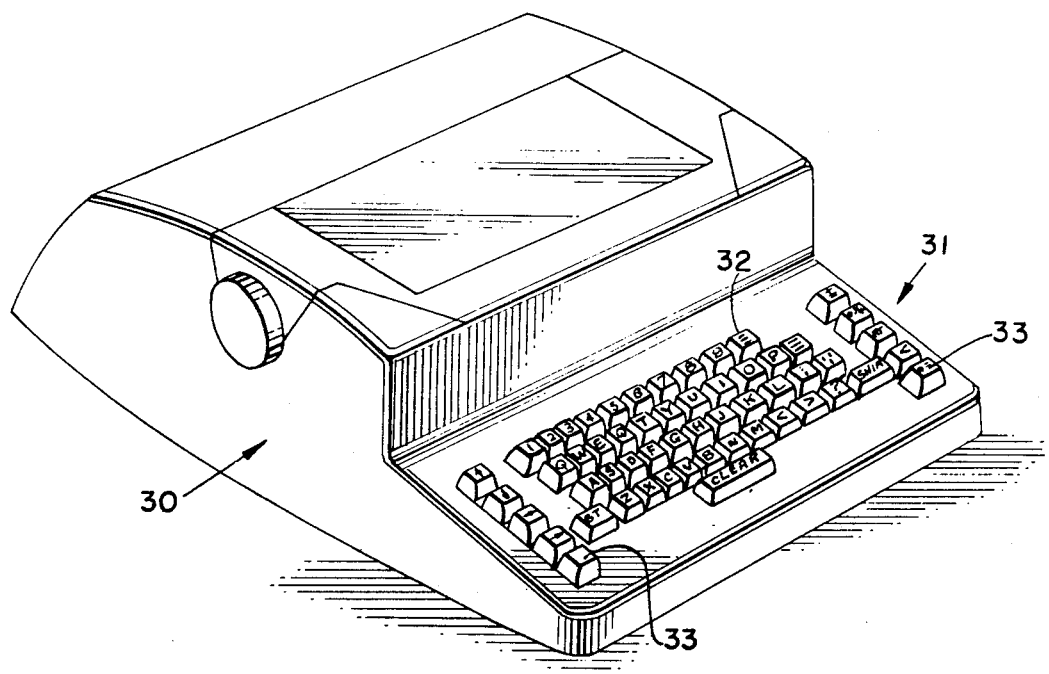
FIG. 1 is a perspective of a terminal incorporating the elements of this invention.

30: Terminal
31: Keyboard
32: Character keys
33: Special purpose keys
34: Keyboard cover
35: Base plate
40: Switch
41: Key Stem
42: Ellipsoidal reflector reflector
43: Spring rest
44: Spring
45: Cover aperture
46: Base aperture
47: Stem guide
48: First fiber optic
49: Second fiber optic
50: Harness
54: Elliptical reflector
55: Harness
56: First fiber optics
57: Second fiber optics
58: Third fiber optics
59: Emission angle
60: Acceptance angle
61–62: Rays
63: Stem
64: Fiber optics
65: Elliptical reflector
66: Stem
67: Fiber optics
68: Elliptical reflector
69: Pivot
70: Channel reflector
72: Stem
73: Mask
74: Fiber optics
75: Ellipsoidal reflector
81: Light source
82: Reflector
83: Positive lens
84: Axicon lens
85: Fiber optic harness
86: Fiber optics
87: Switch
88: Six fiber bundle
90–95: Collector harnesses
100–105: Collector lenses
110–115: Phototransducers
120: Housing means
121: Optical tunnel
122: Inner harness
123: Sixty-four fiber optics
124: Outer harness

GENERAL DESCRIPTION

Figure 12:
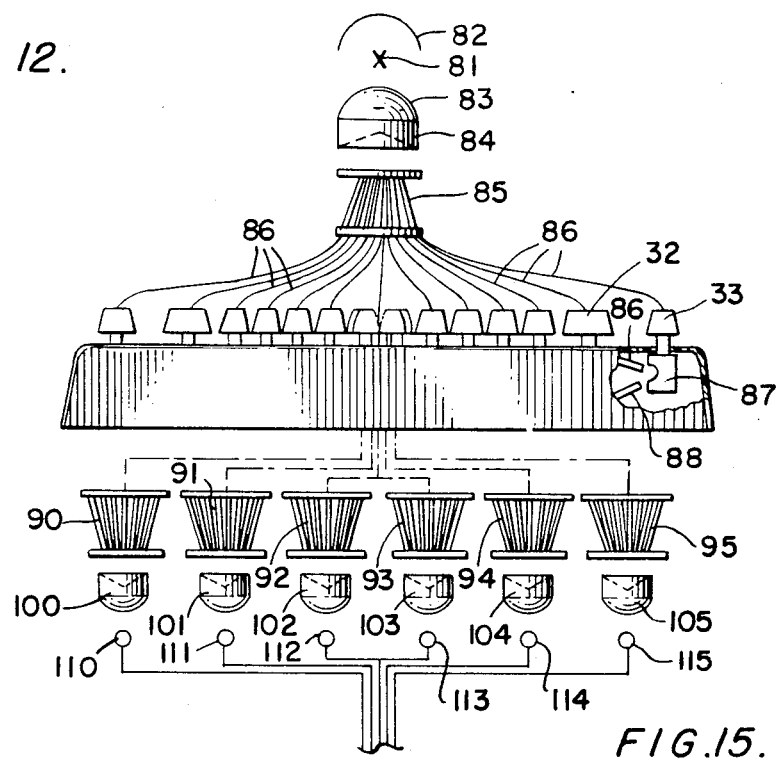
FIG. 12 is a schematic view of the operation of the optical system beginning with the single light source and ending with the generation of the signal indicative of the character.

The operation of the optical keyboard may be described generally with relation to FIGS. 1 and 12. A conventional terminal 30 will have a keyboard 31, character keys 32, and special purpose keys 33. Beneath the keyboard will be a constant light source 81, an optional parabolic reflector 82, positive lens 83, and an axiconic lens 84 to distribute the light into a ring. Fiber optic harness 85 holds fibers 86 in position to receive the light and distribute them to individual keys 32, 33.

Each key has a switch 87 which couples the light to a bundle of six fiber optics 88, both shown elsewhere. These fibers are selectively connected to collector optic harnesses 90–95, which direct light onto axiconic collector lenses 100–105, focusing light on photoelectric transducers 110–115.

Through this arrangement, the light from source 81 may be transformed into a typically six-bit signal, as is well known. For instance, such a signal might be

| Character | Phototransistors | | | | | |
|---|---|---|---|---|---|---|
|  | 110 | 111 | 112 | 113 | 114 | 115 |
| a | on | on | on | on | on | on |
| b | on | on | on | on | on | off |
| c | on | on | on | on | off | off |
| (last) | off | off | off | off | off | on |

Various codes are standard in the industry and the disclosed invention may of course be adapted to any one of them.

The optical keyboard can also be illustrated by the following:

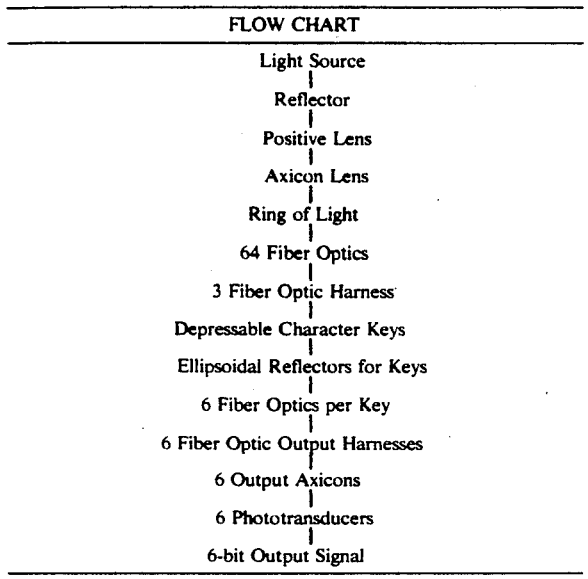

FLOW CHART

Light Source
|
Reflector
|
Positive Lens
|
Axicon Lens
|
Ring of Light
|
64 Fiber Optics
|
3 Fiber Optic Harness
|
Depressable Character Keys
|
Ellipsoidal Reflectors for Keys
|
6 Fiber Optics per Key
|
6 Fiber Optic Output Harnesses
|
6 Output Axicons
|
6 Phototransducers
|
6-bit Output Signal

THE AXICONIC LIGHT DISTRIBUTOR

The objective of this light distributor is to take the energy from a point source of light of from an ambient source of light and to distribute it equally into up to 64 fiber optic bundles. The conventional system for doing it at present is to attempt to focus the light on 64 bundles in close proximity. The present system will transfer the light more efficiently to the bundles, each bundle receiving approximately the same amount of light and therefore, the transfer will occur with much greater efficiency than in the conventional system.

The light distribution system will be explained with reference to FIGS. 25 through 31, which are schematic ray tracings, greatly exaggerated for clarity. Each of the drawings are to the same scale and include a point source of light P, positive lens PL having a focal distance f and positive cone PC and negative cone NC. The point source of light is shown disseminating four rays, $a$, $b$, $c$ and $d$.

FIG. 25 shows a point source of light P at the focus of this positive lens PL. The positive lens transforms the diverging rays $a$, $b$, $c$ and $d$ into parallel rays which focus at infinity.

FIG. 26 shows the point source P inside the focal point of positive lens PL, refocusing the rays $a$, $b$, $c$ and $d$ onto point FP.

In FIG. 27, the point source of light P is directed onto the plane surface of a conical lens PC. The conical lens has the property that a point source P on the axis of revolution is imaged by the axicon to a range of points along the axis A, as illustrated I(1), I(2).

FIG. 28 shows a point source of light P shining onto the plane surface at the base of an axicon NC having a negative cone. Here the rays $a$, $b$, $c$ and $d$ of light are not focused but continually diverge as shown.

Figure 29:
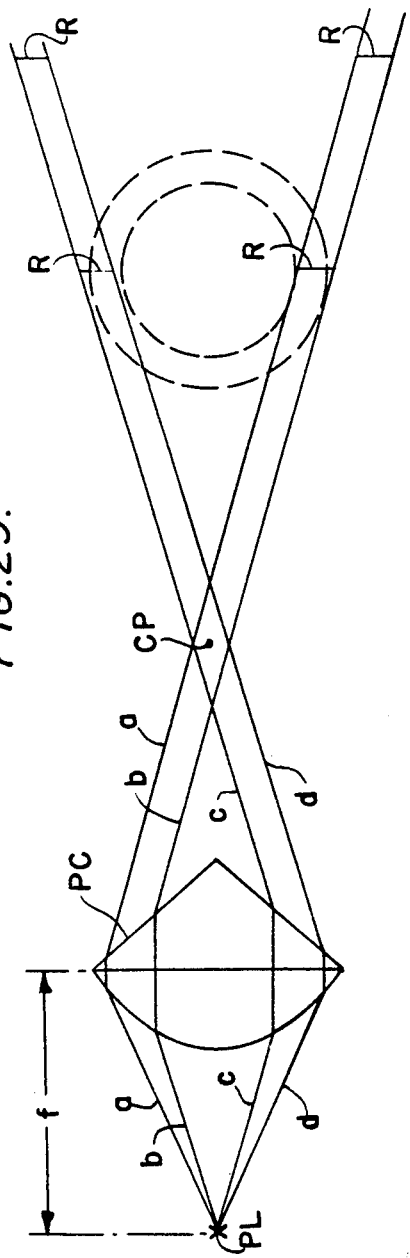

FIG. 29 shows a point source of light P at focal distance of the positive lens PL which is abutted to a positive cone axicon PC. The positive lens bends the rays of light into parallel alignment and they emerge from the positive cone in a parallel converging and then diverging cone. The ring of light at any point R is of approximate constant thickness depending on the spherical aberration of lens PL.

Figure 30:
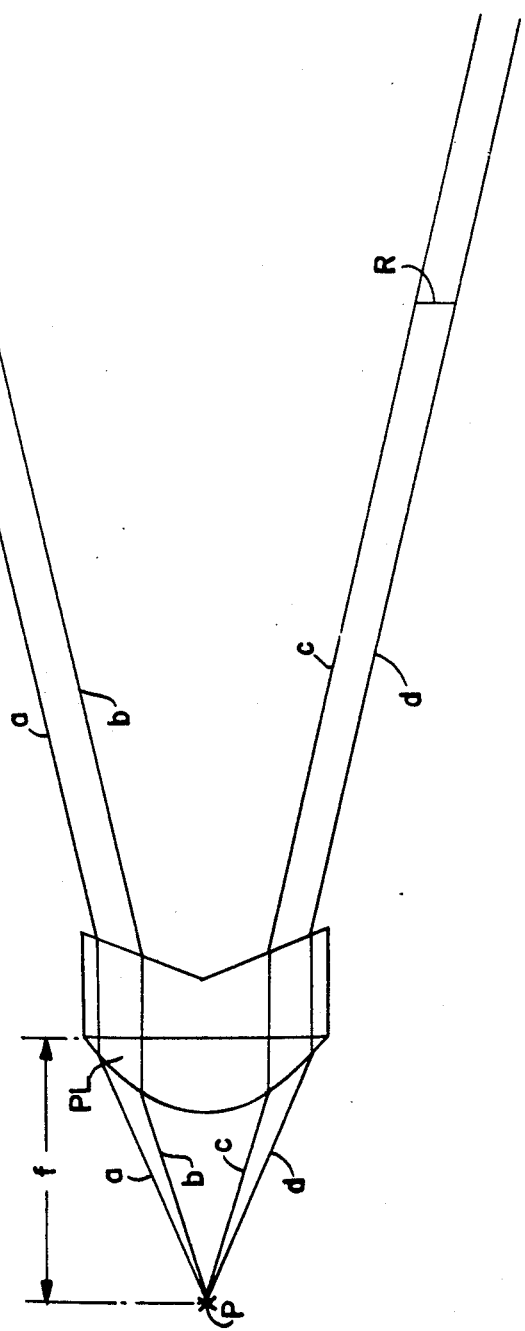

FIG. 30 shows the point source of light P at focal point of positive lens PL, which is abutted to a negative cone axicon NC. The positive cone transforms the diverging rays $a$, $b$, $c$ and $d$ into parallel rays and they emerge from the negative cone axicon in a diverging cone of similarly approximate constant thickness R.

FIGS. 31 and 32 each show the point source of light P inside the focal distance f of the positive lens PL. In FIG. 31, the lens is abutted to a positive cone PC and in FIG. 32, is abutted to a negative cone NC.

As in FIG. 26, the positive lens converges the rays within the lens system. In FIG. 31, the rays emerge in a converging then diverging cone, forming a diverging ring R of increasing thickness part the point of approximate focus F.

In FIG. 32, the rays emerge from the negative cone in an expanding cone which approximately focuses at point F and forms a ring of light inside the focal point R of decreasing thickness, then of increasing thickness past point F.

PREFERRED EMBODIMENTS a. Light Distributor and Collector

The keyboard uses one distributor to take the energy from a single constant light source and distribute it typically to each of up to 64 keys. The light is then collected from each of these 64 keys suitably coded, and focused on each of 6 phototransducers. The light distributor and light collector lens systems operate in similar fashion so the single distributor and 6 collectors will be described here only once.

Figure 6:
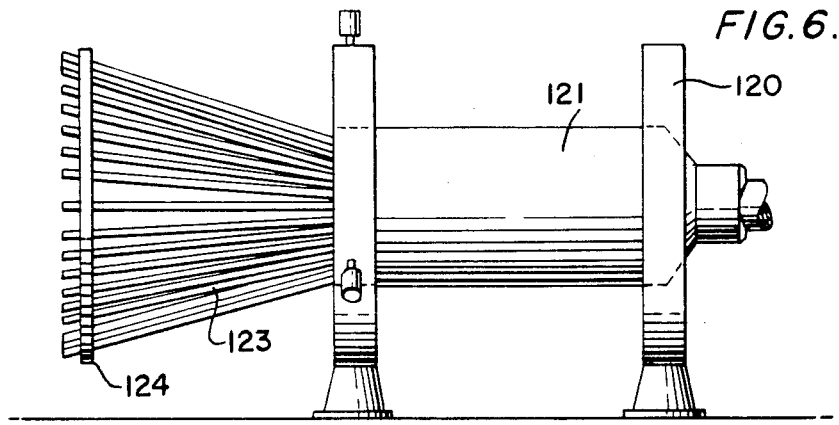
FIG. 6 is a side elevation view of a light distribution system using an axicon.
Figure 7:
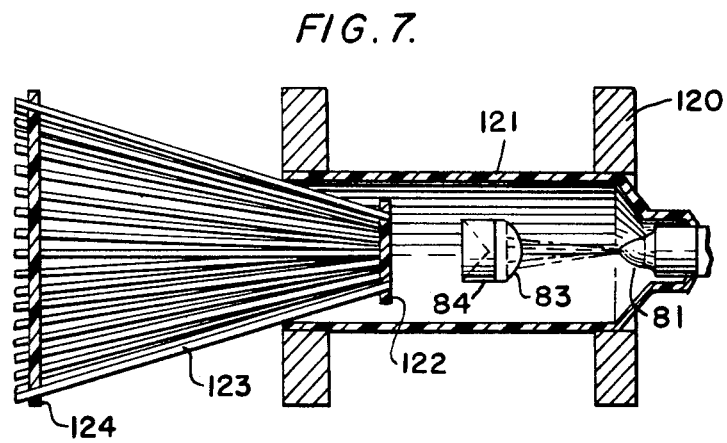
FIG. 7 is a view similar to FIG. 6 partially cut away to show the light source and axicon.

In FIGS. 6 and 7 is shown a working model of the light distributor. Suitable housing means 120 hold an optical tunnel 121 which has mounted in it light source 81, a positive lens 83 and a negative axicon lens 84. Also mounted in the tunnel is the inner harness 122 holding the inner ends of 64 fiber optics.

Outer harness 124, suitably mounted, holds the fiber optics at the desired angle, so that their ends are normal to the diverging rays of light from the lens system.

The geometrical relationship between the fiber optics 123 and harnesses 122 and 124 and the lens system 83 and 84 can be explained with reference to FIG. 32. The purpose is to locate the ring of fiber optics in the plane of the diverging cone defined by rays $a$ and $b$, and rays $c$ and at a distance D where the diameter of the optical ring R is equal to the diameter of the fiber optics to maximize the amount of light emerging from the lens systems which shines on the fiber optics. The angular inclination of the fiber optics should be such that their axes are in the ring of light, thus insuring maximum acceptance of the light.

Referring to FIG. 12, the output fibers from each of the character keys 32 will be placed in from 1 to 6 of the collector harnesses 90 through 95. The arrangement of these harnesses, the collector lens system, 100 through 105, and the phototransistors 110 through 115 are such that the light from any fiber optic in the collector harness is focused on the phototransistors. Since each fiber optic must supply sufficient energy to activate the phototransistors, and this system insures maximum equal coupling of energy from each fiber optic, the energy required in the fiber optic system is thus minimized.

The Reflector Switch

Each of the character keys 32 and the special purpose keys 33 have a similar optical switch which is here described for one character only.

Each key is bivalued in that it transmits one signal when in the raised position, and one signal in the lowered position.

The simplest system is to transmit a light signal when the key is lowered and to transmit no light signal when the key is raised. The preferred embodiment uses three fiber optics, transmitting a signal in one fiber optic when the key is raised and transmitting a second signal in a different optic when the key is depressed. This preferred embodiment allows for an additional safety margin, practically eliminating erroneous signals, as is well known in the art.

Referring to FIGS. 2 through 5, a character key 32 has depending from it stem 41, spring rest 43, and stem guide 47. The stem 41 extends through aperture 45 in cover 34 and the stem guide 47 extends through aperture 46 in base plate 35.

Figure 2:
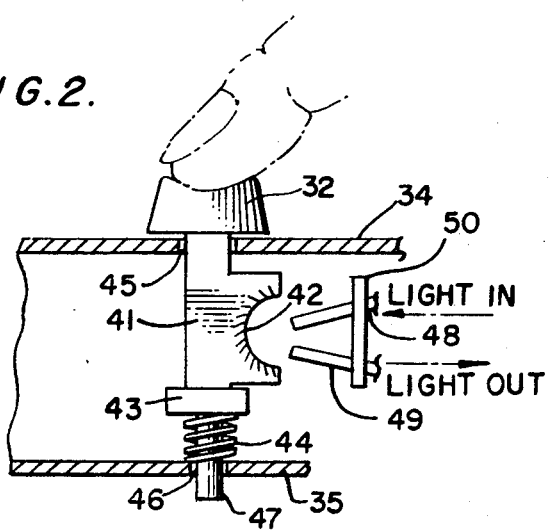
FIG. 2 is a cross-section of a typical key in its depressed position activating a two-element optical switch.
Figure 3:
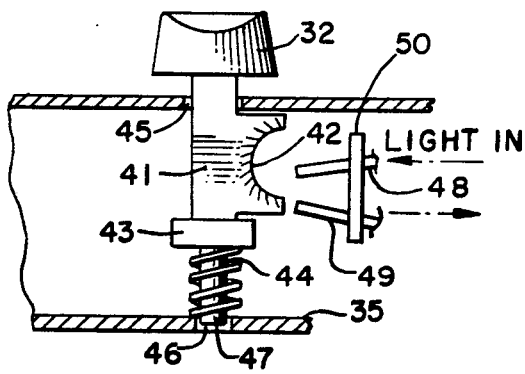
FIG. 3 is a view of the same key shown in FIG. 2 in the elevated or inoperative position.

As shown in FIGS. 2 and 3, the key is normally biased upwardly and may be depressed by the operator, until the key 32 contacts cover 34 or another stop.

Integral with the stem 41 is an ellipsoidal reflector 42, as shown in FIGS. 2 and 3 and rigidly mounted on the base 35 is harness 50, containing a first fiber optic 48 and second fiber optic 49. These fiber optics are so aligned that when the key is depressed the ends of the two fiber optics are at the focal points of the ellipsoidal reflector 42 and all of the light emanating from the first fiber optic 48 is coupled to the second fiber optic 49. At any other position, from the fully depressed position to the fully raised position as shown in FIG. 3, almost none of the light from fiber optic 48 is coupled to fiber optic 49. At the fully raised position one of the fibers is blocked by the shoulder of element 42 and no light is coupled.

Figure 4:
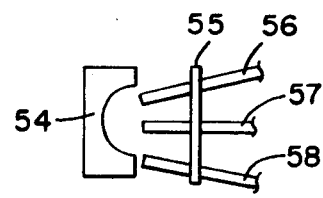
FIG. 4 is a partial cross-sectional view of a three-element optical switch in the upper position.
Figure 5:
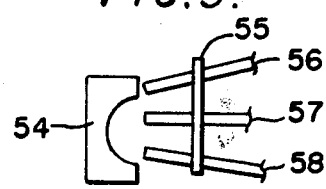
FIG. 5 is a view similar to FIG. 4 of the same switch in its lower position.
Figures 8, 9, 10:
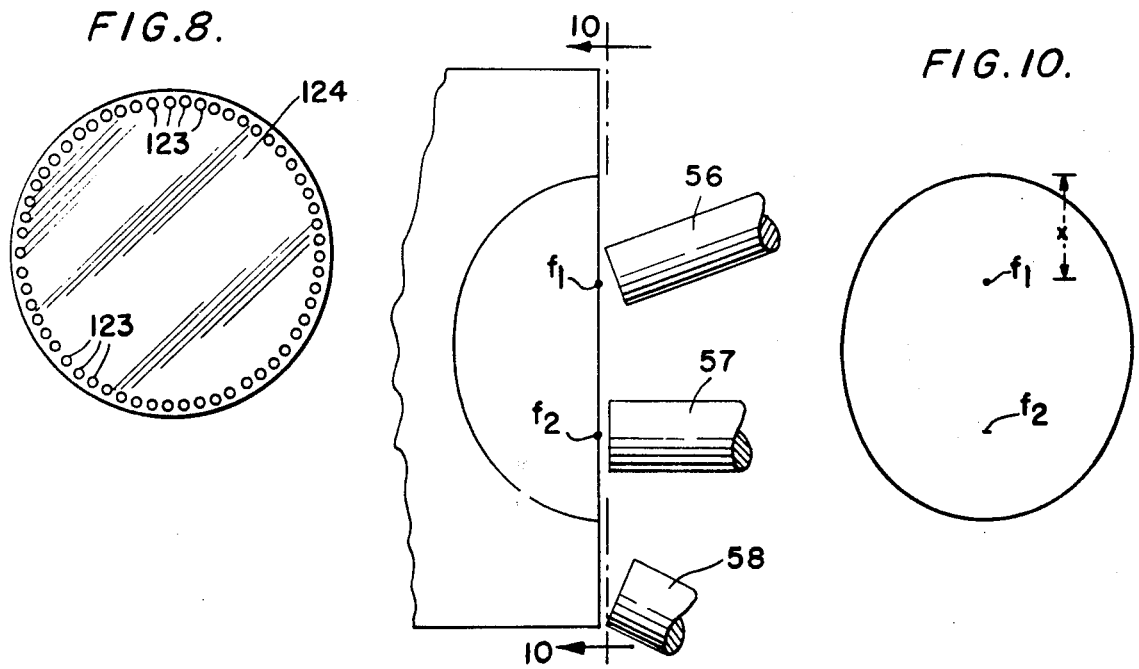
FIG. 8 is a front view of the fibre optic harness shown in FIGS. 6 and 7.
FIG. 9 is an enlarged cross-sectional view of the key coupling system of FIG. 4, where $f_1$ and $f_2$ are the foci of the ellipsoid.
FIG. 10 is a view taken on lines 10–10 of FIG. 9, showing the ellipsoid reflector in profile.

The three-way fiber optic switch is illustrated in FIGS. 4 and 5, and in successive enlargements in FIG. 9. The ellipsoidal reflector 54 moves from the raised position shown in FIGS. 4 and 9, to the lowered position shown in FIG. 5. Harness 55 holds fiber optics 56, 57 and 58 in a fixed position. When the reflector is in the raised position, input fiber 57 is at the lower of the focal points, and upper fiber 56 is at the upper of the focal points. All of the light emanating from fiber 57 is coupled to fiber 56. As shown, a light signal in fiber 56 would indicate the key is raised.

The reflector 54 moves a distance equal to the distance between the two focal points of the ellipsoidal reflector. When in the lowered position as illustrated in FIG. 5, the light from fiber 57 is coupled to fiber 58. This is designed to be compatible with the usual keyboard distance of one eighth of an inch with a standard spring pressure 4 and 5 inches. To ensure blocking the fiber at the "off" position the ellipsoid will have to be such that the distance $f_1-f_2$ shown in FIG. 10 is greater than the distance $x$.

Figure 11:
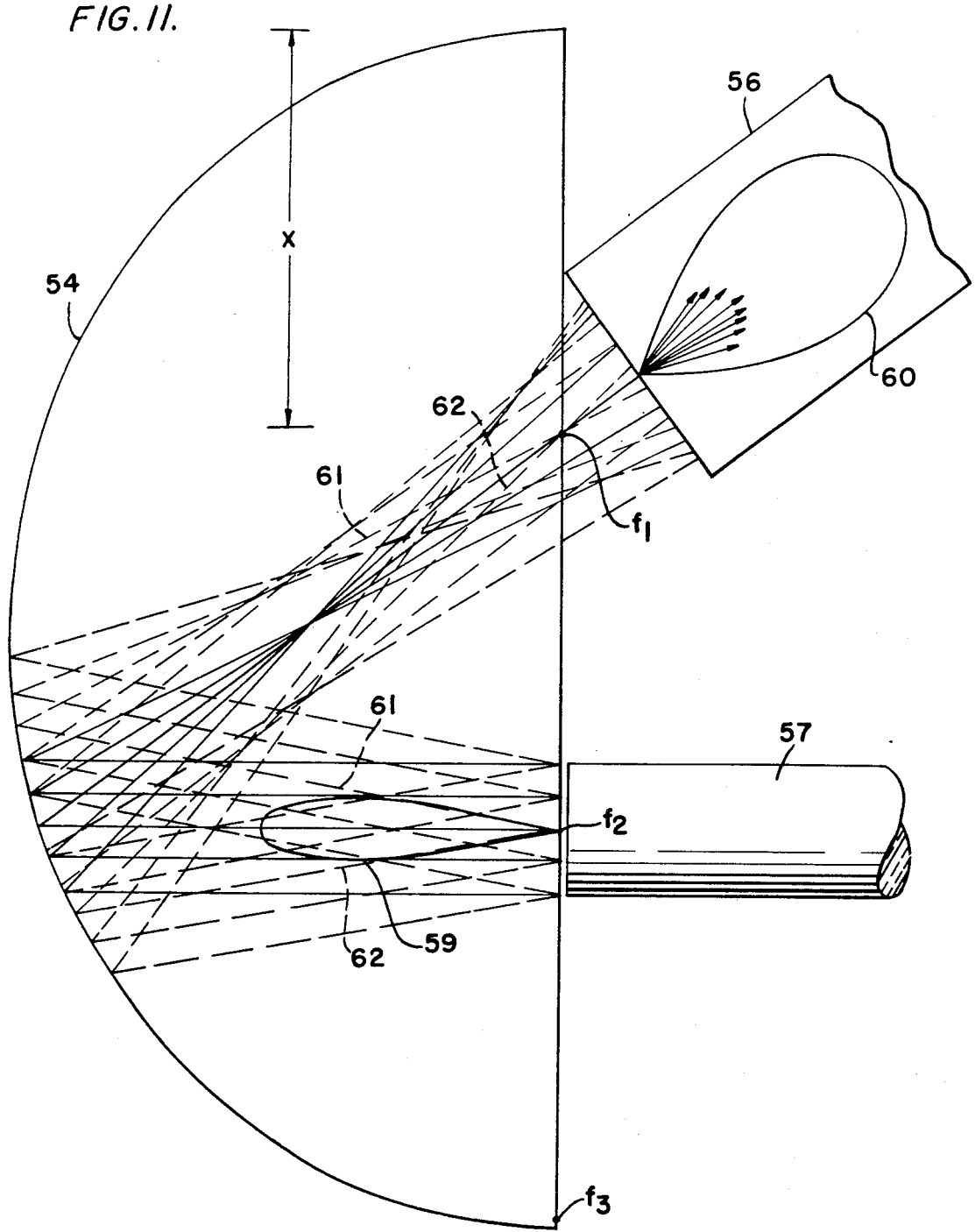
FIG. 11 is a view of an ellipsoidal reflector showing the relative intensities of the rays at small angles from the axis of the fiber optic.

The diagram in FIG. 11 while not to scale in that $f_1-f_2$ is less than $x$ illustrates represents the symmetrical arrangement of the ellipsoidal reflector and the three fiber optic system. This arrangement takes advantage of a well-known geometrical principle that light emanating from one focal point, here $f(2)$, including diverging rays 61 and 62 will come together again at a focus at the other focal point $f(1)$ of the ellipse. From 57 other diverging rays come together again at 56.

As shown by the plot in FIG. 11 of intensity versus emission angle 59, from the input fiber 57, the rays emerge in an extremely well collimmated path with virtually all of the energy within a few degrees of the extension of the axis of the fiber.

Fiber optics have an acceptance angle roughly twice as wide as their emission angle (Reference: *Applied Optics*, Vol. 10, No. 5, May 1971, Page 1146) as shown by the plot of the acceptance angle 60 on output fiber 56. As can be seen from FIG. 11, virtually all of the energy from fiber 57 is coupled to fiber 56 when the reflector is in the position shown, when fiber 56 is about twice the diameter of fiber 57 which is the case in practice when 56 is a bundle of six or more fibers.

As will be immediately apparent to those skilled in optical technology, a slight relative movement of reflector 54 will decouple all of the energy from fiber 57 in fiber 56. As the reflector 54 moves to its lowered position, where points $f(2)$ and $f(3)$ become the focal points of the ellipse, the light energy emanating from fiber 56 will swing from position $f(1)$ to $f(3)$, a distance twice the movement of the reflector itself.

DESCRIPTION OF ALTERNATIVES a. The Distributor and Collector System

Figure 20:
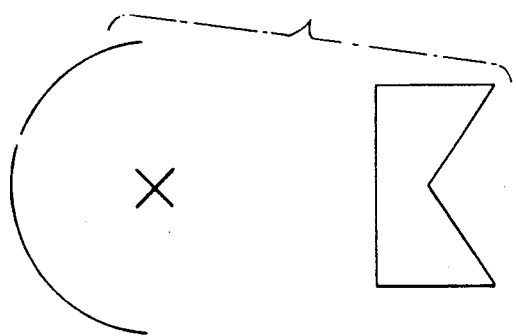
FIG. 20 is a schematic representation of a parabolic reflector, light source and negative axicon.
Figure 21:
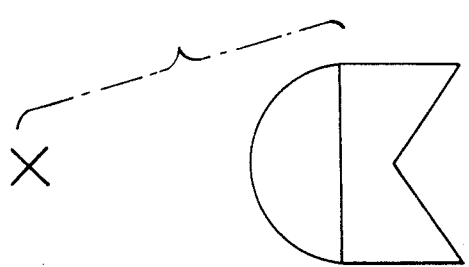
FIG. 21 is a schematic representation of a light source, positive lens and negative axicon.

The preferred embodiment of this lens system as illustrated in FIG. 32 produces a diverging cone of light of decreasing thickness, coming to an approximate focus and then further diverging. This is accomplished by the point source of light, positive lens and negative axicon as also illustrated in FIG. 21. The positive lens can be replaced by a parabolic mirror as shown in FIG. 20, to create parallel, or nearly parallel, rays of light.

Figure 22:
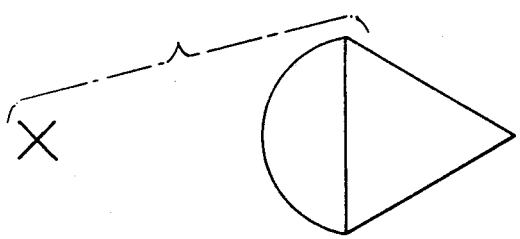
FIG. 22 is a schematic representation of a light source, positive lens and positive axicon.
Figure 24:
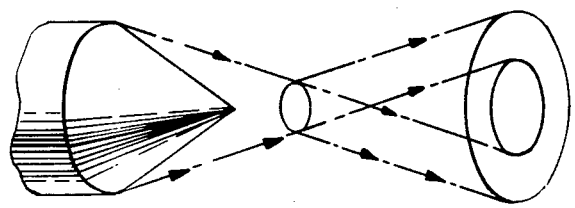
FIG. 24 is a schematic representation of the field of light emitted by a conical lens.

A positive cone lens may also be used in place of a negative cone lens as illustrated in FIGS. 22, 24 and 31.

Figure 23:
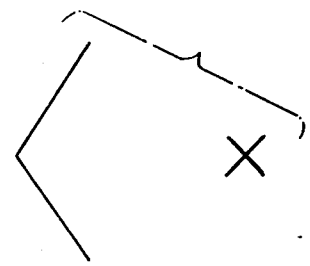
FIG. 23 is a schematic representation of a light source and reflective axicon.

A conical reflector may also be employed to create the diverging cone of light as shown in FIG. 23.

Referring to FIG. 12 harnesses 85 and 90 through 95 have been shown with ends of the fiber optics facing the apex of the cone and adapted to either receive a diverging cone of light as harness 85, or to transmit a converging cone of light as in harnesses 90 through 95.

An alternative system would have the fiber optic ends facing away from the apex and thus receiving a converging cone of light or transmitting a diverging cone of light.

Figure 17:
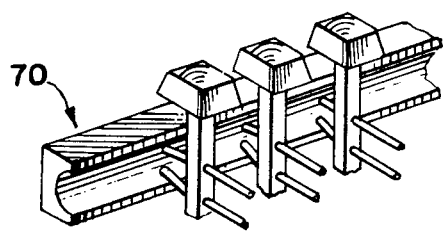
FIG. 17 is a view of a third alternative where a row of keys use a single elongated reflector.

With this alternative, it would be possible to mount the fiber optic harness, with reference to FIG. 31, inside the cross-over point CP of the rays instead of outside point CP or of the focus F at point R where the rays have diverged to form a ring of light equal to the diameter of the fiber optic bundles. This would then allow the positive cone lens as shown in FIG. 31 to be more compact as the harness in the lens system would be brought closer together. Likewise the ends of the fibers in FIG. 32 could be mounted inside or outside the focus F. The Reflector Switch As shown in FIG. 17 a channel reflector 70 may be used with an elliptical cross-section cavity. This reflector is limited by sideways scatter down the long axis of the channel.

Numerous mechanical arrangements of fiber optics and ellipsoidal reflectors would allow the energy to be coupled at one position of the key and decoupled at a second position of the key.

Figure 13:
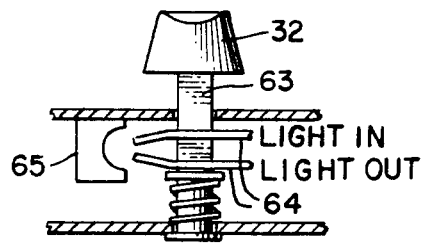
FIG. 13 is a view of an alternative light coupling system for a key with the key in the raised position.
Figure 14:
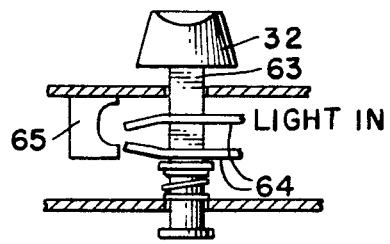
FIG. 14 is a view similar to FIG. 13, showing the key depressed and the fiber optics misaligned from the reflector, decoupling the light.

In FIGS. 13 and 14, key 32 has depending stem 63 carrying fiber optics 64 which are facing reflector 65. The reflector is rigidly mounted and when the operator depresses key 32, as shown, the two fiber optics move from the light coupling position, the focal points, to a non-coupling position.

Figure 15:
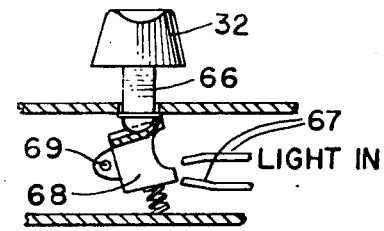
FIG. 15 is a second alternative of the key coupling system, showing a pivoted reflector.
Figure 16:
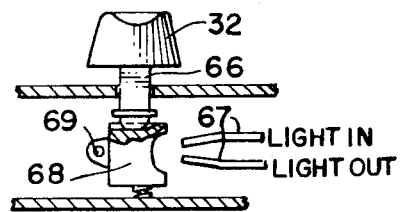
FIG. 16 is a view similar to FIG. 15, showing the pivoted reflector in the depressed or coupling position.

As shown in FIGS. 15 and 16, the fiber optics 67 for each key may be fixed and the key stem 66 may rotate reflector 68 around pivot 69. When depressed, reflector 68 is aligned so that the ends of fibers 67 shown in FIG. 16 are at the two focal points coupling light between them. As shown the axis of rotation of the reflector is horizontal but another configuration, not shown, would have the axis vertical.

Figure 18:
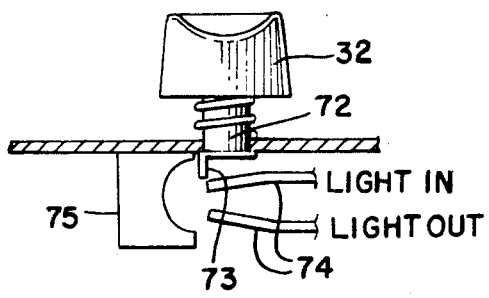
FIG. 18 is a fourth alternative for a key coupler showing the key with a light blocking element in a coupling.
Figure 19:
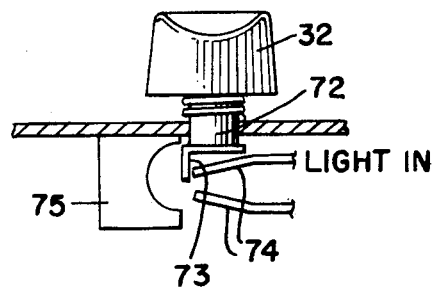
FIG. 19 is a view similar to FIG. 18 showing the key in a depressed and blocked position.

Another variation as shown in FIGS. 18 and 19 is to have both the ellipsoidal reflector 75 and the fiber optics 74 in fixed position. character key 32 has a stem 72 and a mask 73. The fibers 74 are aligned at the focal point of the reflector 75. By depressing character key 32, the operator will merely mask the light from one fiber optic thus decoupling the system. Alternatively, the mask could block the light in the raised position and transmit light in the lowered position.

SPECIFIC EXAMPLE I Axicon Lights Distributing System

Light Source

Philips bicycle tail lamp — 40 ma at 1.5 volts
distance to vertex of lens — 45 mm

Positive Lens focal length — 76 mm
diameter — 76 mm

Conical Lens material — plastic acrylic
index of refraction — 1.45
diameter — 76 mm
height of cone — 9.5 mm
central angle of cone — 152°

Emitted Light distance from light source — 120 mm
thickness of ring — 0.08 inch
diameter of ring — 38 mm

Fiber Bundles number — 36
type — Crofon 1310
fibers per bundle — 32
diameter of fiber — 0.01 inch

SPECIFIC EXAMPLE II Keyboard For Airline Reservation Terminal

Keyboard

Keys — 56
Key travel — 0.125 inch
Key bias — 3.0 inch ounces

Light

Type — Philips bicycle tail lamp model 7121D
Voltage — one half rated voltage 3.0 volt
Current — 30 milliamps
Output — under 0.005 milliwatts/cm$^2$

Distributor Lens System

Type — plano-convex
Diameter — 4.8 mm
Focal length — 57 mm
Type — negative axicon
Index — 1.56
Diameter — 48 mm
Material — plastic acrylic
Angular refraction — 14°

Distances

Source to lens vertex — 45 mm
Ring of light diameter — 46 mm
Thickness of ring — 3 mm
Axicon lens to ring — 120 mm

Fibers

Type — Dupont Crofon
Size — 1 mm diameter

Three Fiber Switch

Input fiber diameter — 0.04 inch
Output fiber diameter — 0.08 inch
Inclination of output fiber — 35°

Ellipsoidal Reflector

Material — acrylic plastic
Shape — semi prolate ellipsoid
Major axis — vertical
Major axis — 0.375°
Minor axis — 0.352 inch
Distance between axes — 0.125 inch
Coating — highly reflective (aluminum or rhodium or other)

Output

Number — six phototransistors
Type — Fairchild FPT 120A
Active surface — 1.50 sq mm
Minimum fiber light output to operate phototransistor — 0.1 foot candle

I claim:

1. A system for coupling light transmitted in a first optical fiber bundle to a second optical fiber bundle comprising,
   a. a reflecting surface having a semi-ellipsoidal cavity, the major axis of said ellipsoid being in the plane of the open end of the reflecting surface,
   b. said first and second fiber bundles located at the foci of said semi-ellipsoidal reflecting surface when in a light coupling position,
   c. the ends of said first and second fiber bundles pointing toward said semi-ellipsoidal reflecting surface,
   d. said semi-ellipsoidal reflecting surface and said pair of fiber bundles movable relative to one another to displace one of said bundles from the location of the foci of the semi-ellipsoidal reflecting surface so that cutoff of light is accomplished, whereby light is coupled from said first fiber bundle to said second fiber bundle when the ends of the fiber bundles are located at the foci of said semi-ellipsoidal reflecting surface and light transmitted in said first fiber bundle is not so coupled when said elements are relatively displaced.

2. The coupling system of claim 1 in which the reflecting surface moves and the fiber bundles are stationary.

3. The coupling system of claim 2 in which the reflecting surface moves laterally.

4. The coupling system of claim 2 in which the reflecting surface rotates around a pivot.

5. The coupling system of claim 2 in which a fiber bundle moves and the reflecting surface is stationary.

6. The coupling system of claim 2 in which a mask is interposed between the reflecting surface and one of said fiber bundles.

7. The coupling system of claim 2 in which the reflector is a channel with an elliptical concavity.

* * * * *